United States Patent
Arizumi et al.

(10) Patent No.: US 6,853,325 B2
(45) Date of Patent: Feb. 8, 2005

(54) PULSE WIDTH MODULATION DIGITAL AMPLIFIER

(75) Inventors: Masako Arizumi, Tokyo (JP); Hiroyuki Harada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/740,754

(22) Filed: Dec. 22, 2003

(65) Prior Publication Data

US 2004/0130472 A1 Jul. 8, 2004

(30) Foreign Application Priority Data

Dec. 27, 2002 (JP) ........................................ 2002-381855

(51) Int. Cl.[7] .............................................. H03M 1/82
(52) U.S. Cl. ........................ 341/152; 341/144; 330/10
(58) Field of Search ................................ 341/144, 152; 330/10

(56) References Cited

U.S. PATENT DOCUMENTS

| | | | | |
|---|---|---|---|---|
| 4,673,889 A | * | 6/1987 | Cini et al. ..................... | 330/10 |
| 5,008,675 A | * | 4/1991 | Toyomaki .................... | 341/152 |
| 5,307,025 A | * | 4/1994 | Colvin et al. ................ | 330/267 |
| 5,343,197 A | * | 8/1994 | Kanai et al. ................. | 341/152 |
| 5,539,403 A | * | 7/1996 | Tani et al. ................... | 341/144 |
| 5,559,467 A | * | 9/1996 | Smedley ....................... | 330/10 |
| 5,617,058 A | * | 4/1997 | Adrian et al. ................ | 330/10 |
| 5,724,039 A | * | 3/1998 | Hayashi ...................... | 341/144 |
| 6,107,876 A | * | 8/2000 | O'Brien ....................... | 330/10 |
| 6,208,280 B1 | * | 3/2001 | Baker et al. ................. | 341/152 |
| 6,344,811 B1 | * | 2/2002 | Melanson .................... | 341/143 |
| 6,731,162 B2 | * | 5/2004 | Yeongha et al. ............. | 330/10 |

FOREIGN PATENT DOCUMENTS

| | | |
|---|---|---|
| JP | 05-055924 | 3/1993 |
| JP | 06-196940 | 7/1994 |
| JP | 11-027058 | 1/1999 |

* cited by examiner

*Primary Examiner*—Michael Tokar
*Assistant Examiner*—Khai Nguyen
(74) *Attorney, Agent, or Firm*—Leydig, Voit & Mayer, Ltd.

(57) ABSTRACT

In a digital amplifier, a time controller generates first and second selection signals for outputting any one of music data, a center output, and a lowest output to a P output and an N output based on a power ON/OFF signal and a start/stop signal, and also generates a third selection signal for determining whether a signal having the same phase as that of the P output is output to the N output or a signal obtained by inverting the P output is output to the N output. A data selection circuit determines data to be output to the P output and the N output based on the first and second selection signals. An output data register circuit converts parallel data determined by the data selection circuit into serial data to output the serial data into the P output. An output selection circuit determines the N output based on the third selection signal.

8 Claims, 12 Drawing Sheets

US 6,853,325 B2

PULSE WIDTH MODULATION DIGITAL AMPLIFIER

BACKGROUND OF THE INVENTION

1) Field of the Invention

The present invention relates to a digital amplifier for an audio system. More particularly, this invention relates to a digital amplifier that adopts a pulse width modulation (PWM) system.

2) Description of the Related Art

Battery-operated apparatuses having built-in speakers, such as notebook size personal computers, portable compact disk (CD) players, digital versatile disc (DVD) players, and car audio systems are in common use. In these apparatuses, not only sound quality but also miniaturization and low power consumption are demanded. Due to such background, an attention is paid to digital amplifiers. In a digital amplifier, of these digital amplifiers, that adopts a PWM system used for a pre-amplifier for an audio system, all sections from an input to an output are formed with digital circuits, and therefore all sound signals can be digitally processed. The PWM system can convert a voltage amplitude of sound information into a digital pulse width to thereby directly drive the speakers, and therefore an analog process is not necessary. Accordingly, a compact size amplifier that requires low power and less heating value can be realized.

However, when the PWM system digital amplifier and the speakers are connected by bridge-tied load (BTL) that drives a load using two outputs of a positive polarity and a negative polarity, there arises a problem that a pop sound is produced when the output of the digital amplifier abruptly changes.

In order to improve the problem, in the conventional technology, a level of saw-tooth waveform obtained by converting an oscillation output that has a higher frequency than a frequency of a carrier signal supplied to a pulse width modulator and is synchronized with the carrier signal, is compared with a level of an output of a time constant circuit to which a power supply voltage is applied. The output obtained through the level comparison and the output of the pulse width modulator are supplied to an exclusive-OR circuit and therefore the two outputs have the same phase at the times at which the power is turned on and turned off so as to suppress the production of the pop sound (see Japanese Patent Application Laid-Open No. 06-196940 (1994)).

In the conventional technology, however, when the phase of the output of the exclusive-OR circuit is in a transition state, a sound signal output to the load is disadvantageously distorted. Suppression of the distortion causes a problem to occur such that muting should be applied to the output of the exclusive-OR circuit in a specified period in which the phase of the output of the exclusive-OR circuit is in the transition state.

There is another problem that an integrated circuit and the time constant circuit are used and therefore the process cannot be executed only by using digital signals.

SUMMARY OF THE INVENTION

It is an object of this invention to solve at least the problems in the conventional technology.

The digital amplifier according to the present invention, includes a noise shaper for removing a quantization noise of received data to generate sound data of n bits, where n is an integer larger than one; and a pulse width modulator for modulating a pulse width of output data in response to the sound data in a normal operation, the pulse width modulator including a data selection circuit for performing either one of increase and decrease of the pulse width of the output data stage by stage at every period of a specific clock obtained by dividing a frequency of a basic clock of pulse width modulation by n to set the output data to a center output when a specific operation is indicated.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 shows the P output and N output of a pulse width modulator and an output of a BTL circuit when power is turned on;

FIG. 10 shows a time chart of the operation of the pulse width modulator when the power is turned on;

DETAILED DESCRIPTION

An embodiment of the digital amplifier according to the present invention will be explained below with reference to the attached drawings.

Figure 1:
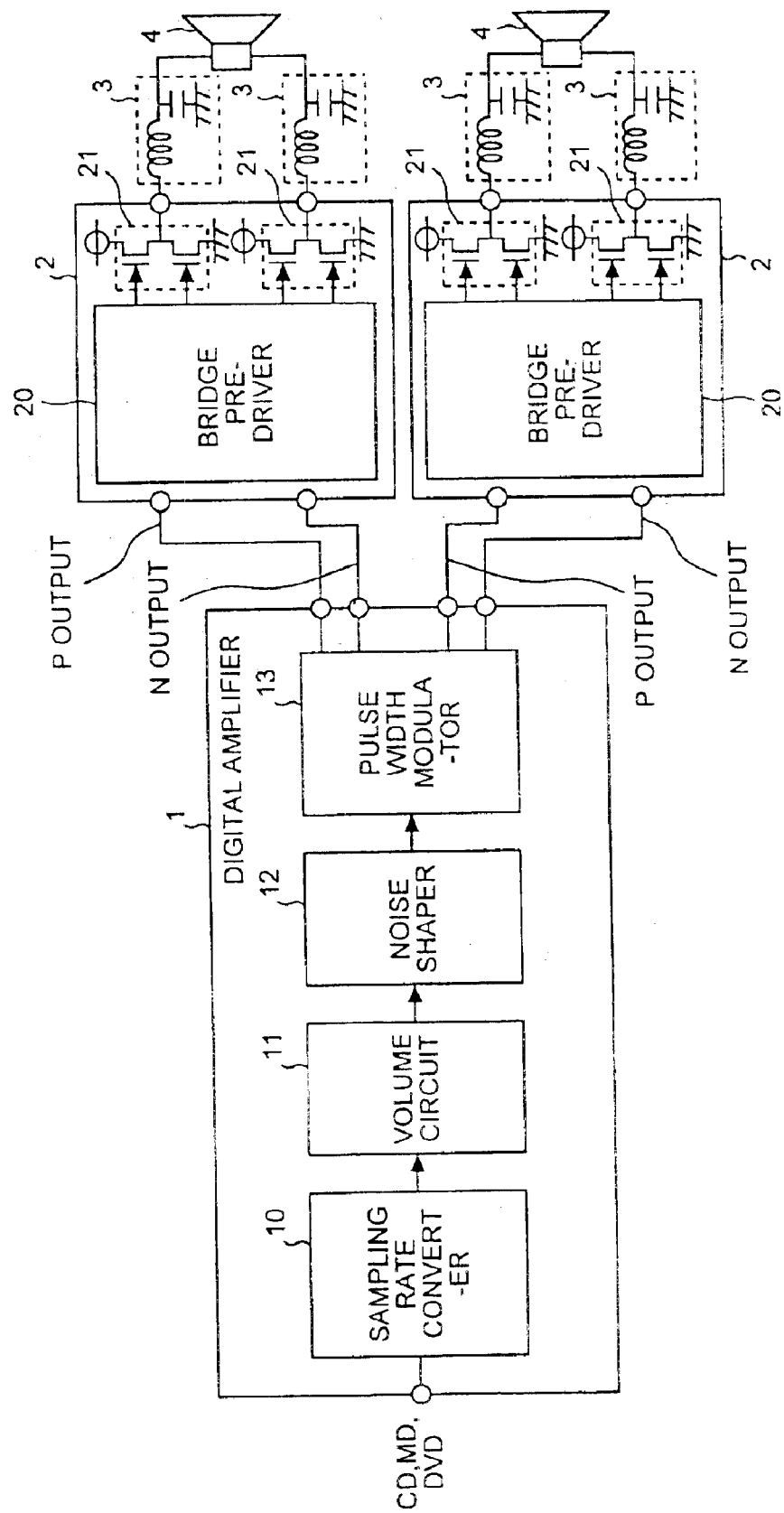
FIG. 1 shows a block diagram of configurations of a digital amplifier and an audio system that adopts the digital amplifier according to an embodiment of the present invention.

The embodiment of the present invention will be explained with reference to FIG. 1 to FIG. 12. FIG. 1 shows a block diagram of the configurations of a digital amplifier 1 and of the audio system that adopts the digital amplifier 1 according to the embodiment of the present invention. The audio system that uses the digital amplifier 1 of this embodiment is constituted as follows. That is, bridge pre-drivers 20 in a BTL circuit 2 drive switching elements 21 composed of two transistors, based on a P output and an N output generated by the digital amplifier 1, and outputs of the switching elements 21 drive speakers 4. The outputs are obtained by removing high frequency components therefrom by low pass filters 3 composed of coils and capacitors.

The digital amplifier 1 outputs a value of n+1 with respect to a number n (n>1, n: integer) of basic clocks determined by a number of bits of sound data output from a noise shaper 12. Since the BTL circuit 2 is operated by differential input, the pulse width modulator has two-series outputs including a P output and an N output obtained by inverting the polarity of the P output. When the P output is half of a number n of the basic clocks, that is, "1" indicating n/2 of the basic clock, this case is determined as a center output of the digital amplifier 1.

Figure 2:
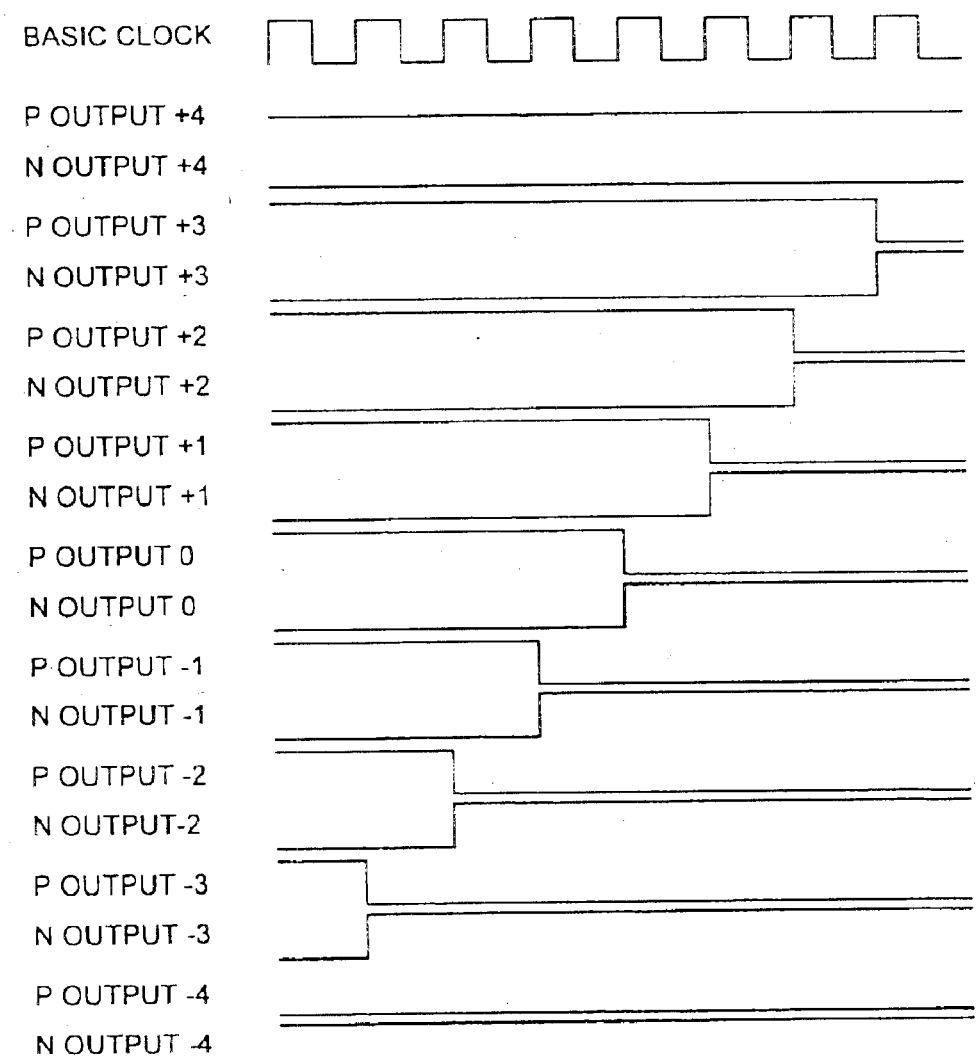
FIG. 2 shows P outputs and N outputs of the digital amplifier.

FIG. 2 shows the P outputs and the N outputs of the digital amplifier 1 when the number n of the basic clocks is eight. If the number of the basic clocks is eight, the P output which becomes the period "1" including four basic clocks is set to the center output "0". In this case, the P output becomes "+1" at the period "1" including five basic clocks, and the P output becomes "+2" at the period "1" including six basic clocks. Moreover, the P output becomes "−1" at the period "1" including three basic clocks, and the P output become "−2" at the period "1" including two basic clocks. The digital amplifier 1 changes pulse widths of the P output and the N output, thereby outputs the nine-stage outputs including from the lowest output "−4" to the highest output "+4" and drives the speakers 4 via the BTL circuit 2 to generate a sound.

The digital amplifier 1 has a sampling rate converter 10, a volume circuit 11, the noise shaper 12, and a pulse width modulator 13. The sampling rate converter 10 converts a frequency of a digital signal recorded at a specified sampling rate in a compact disk (CD), a mini disk (MD), a digital versatile disc (DVD), or the like into a sampling frequency having a sampling rate different from the sampling rate at the time of recording. The volume circuit 11 adjusts a volume of the digital signal based on external instruction. The noise shaper 12 removes a quantization noise. The pulse width modulator 13 executes the pulse width modulating process based on the sound data from which the quantization noise is removed by the noise shaper 12.

Figure 3:
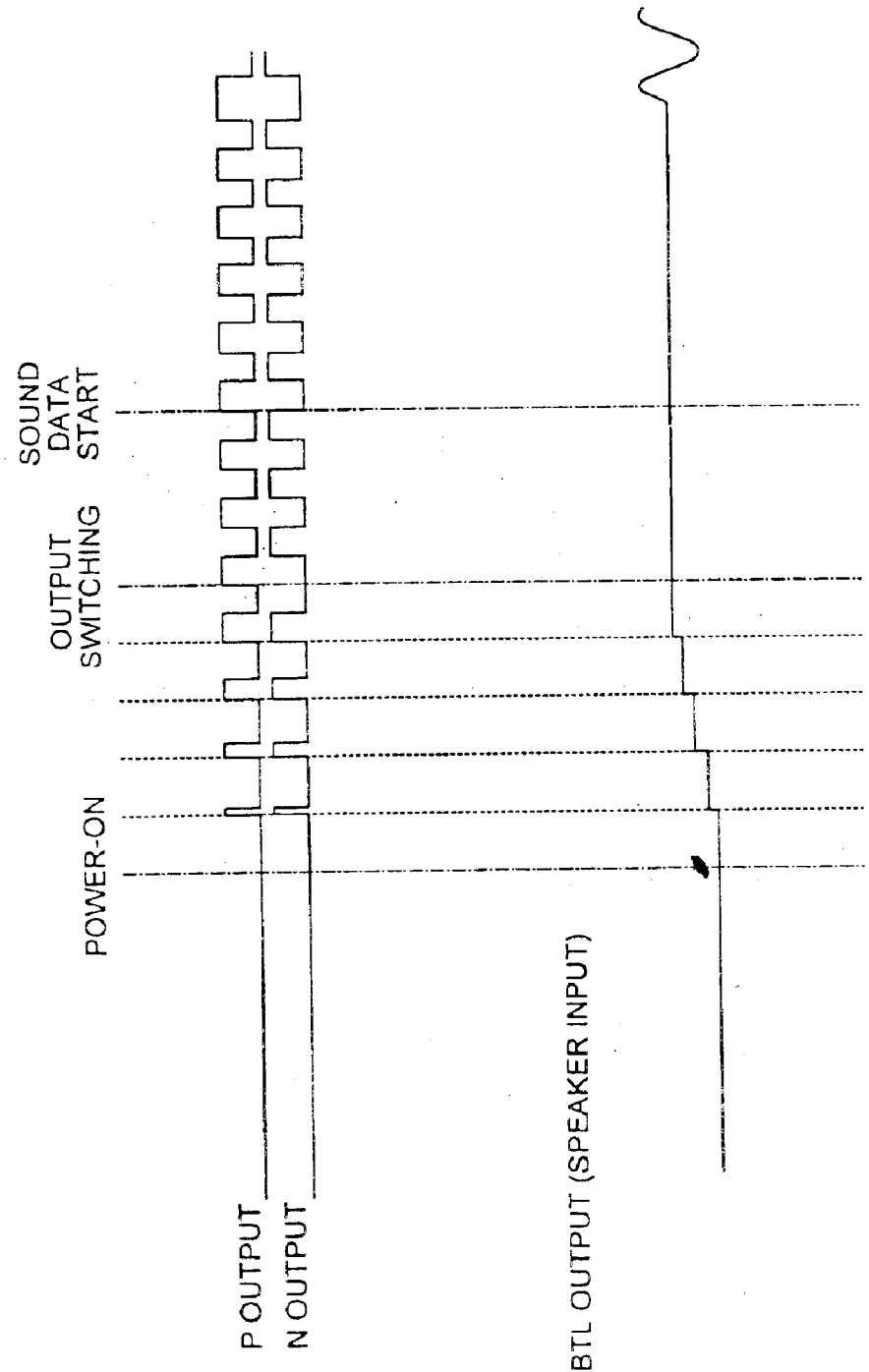

FIG. 3 shows the P output and the N output of the pulse width modulator 13 and the output of the BTL circuit 2 when the power is turned on. The pulse width modulator 13, when the power is turned on, changes the P output and the N output to signals having the same phase and outputs the signals. That is, the pulse width modulator 13 prevents an electric current from flowing in the BTL circuit 2 operated by differential input to prevent sounds from being produced from the speakers 4. Moreover, the pulse width modulator 13 changes the P output and N output with the same phase stage by stage in the order of −4, −3, −2, −1, and 0 from the time when the power is turned on, and fixes the P output and N output to the center output. As a result, the output of the BTL circuit 2 changes gradually to be fixed to the center.

When the P output and the N output are fixed to the center output, the pulse width modulator 13 switches the N output from the signal having the same phase as that of the P output to a signal obtained by inverting the P output.

When the sound data is started, the pulse width modulator 13 executes the pulse width modulating process based on the sound data input from the noise shaper 12 and outputs the P output and the N output to the BTL circuit 2. The BTL circuit 2 drives the speakers 4 based on the P output and the N output to generate a sound.

Figure 4:
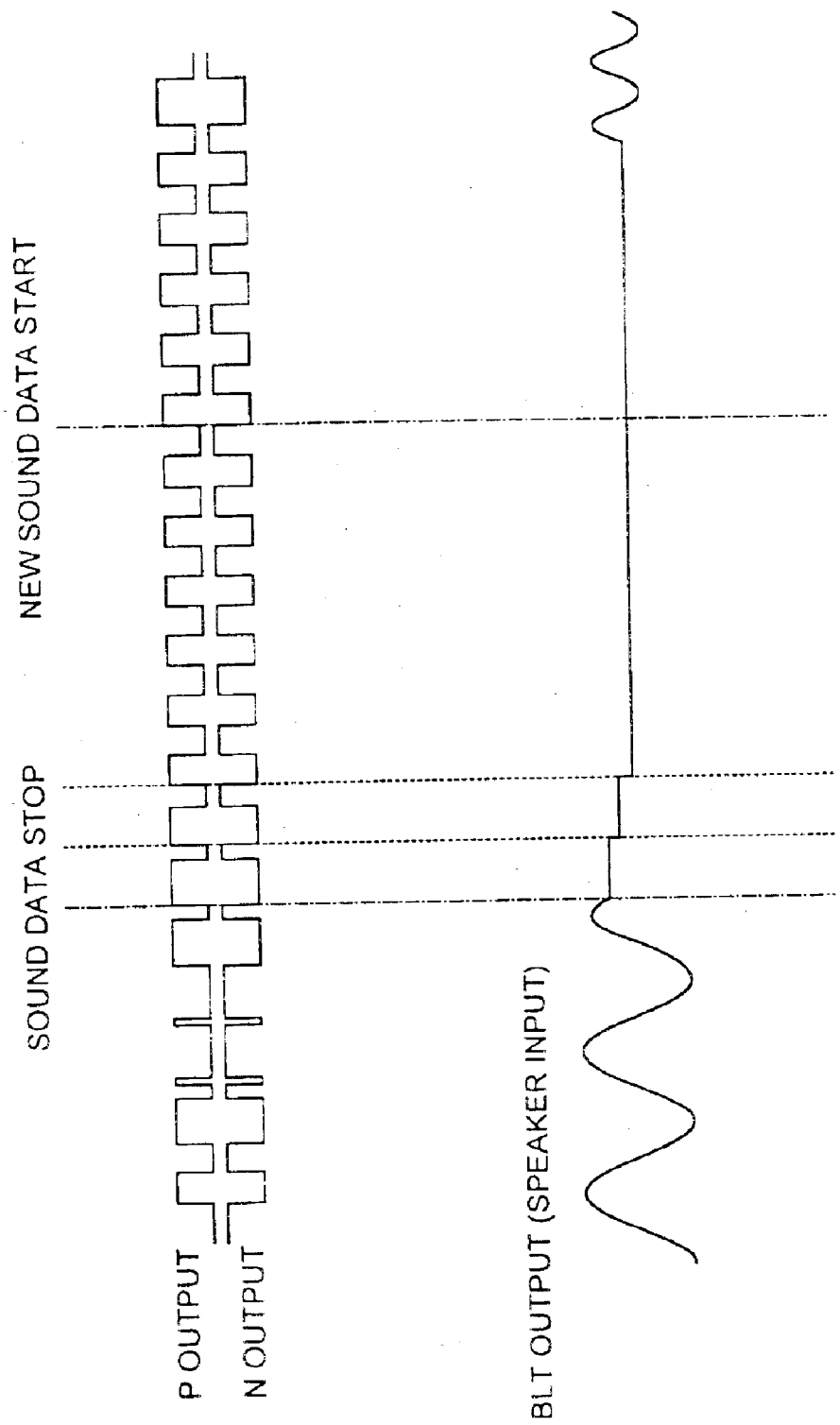
FIG. 4 shows the P output and the N output of the pulse width modulator and the output of the BTL circuit when sound data is stopped and then started.

FIG. 4 shows the P output and the N output of the pulse width modulator 13 and the output of the BTL circuit 2 when the sound data is stopped and then started. The pulse width modulator 13 executes the pulse width modulating process based on the sound data input from the noise shaper 12 until the sound data is stopped and outputs the P output and the N output to the BTL circuit 2. The BTL circuit 2 drives the speakers 4 based on the P output and the N output to generate a sound.

When the sound data is stopped by a stop function or a pause function of the digital amplifier 1, the pulse width modulator 13 successively changes the P outputs stage by stage starting from the value when the sound data is stopped, and sets the P output to the center output. That is, when the P output and the N output are +1 to +4 shown in FIG. 2, the pulse width modulator 13 decreases the P output and the N output stage by stage to set them to the center output, and when the P output and the N output are −1 to −4, it increases them stage by stage to set them to the center output. As a result, the output of the BTL circuit 2 gradually changes to be fixed to the center.

When the sound data is started by a reproduction function of the digital amplifier 1, the pulse width modulator 13 executes the pulse width modulating process based on the sound data input from the noise shaper 12 to output the P output and the N output to the BTL circuit 2. The BTL circuit 2 drives the speakers 4 based on the P output and the N output to generate a sound.

Figure 5:
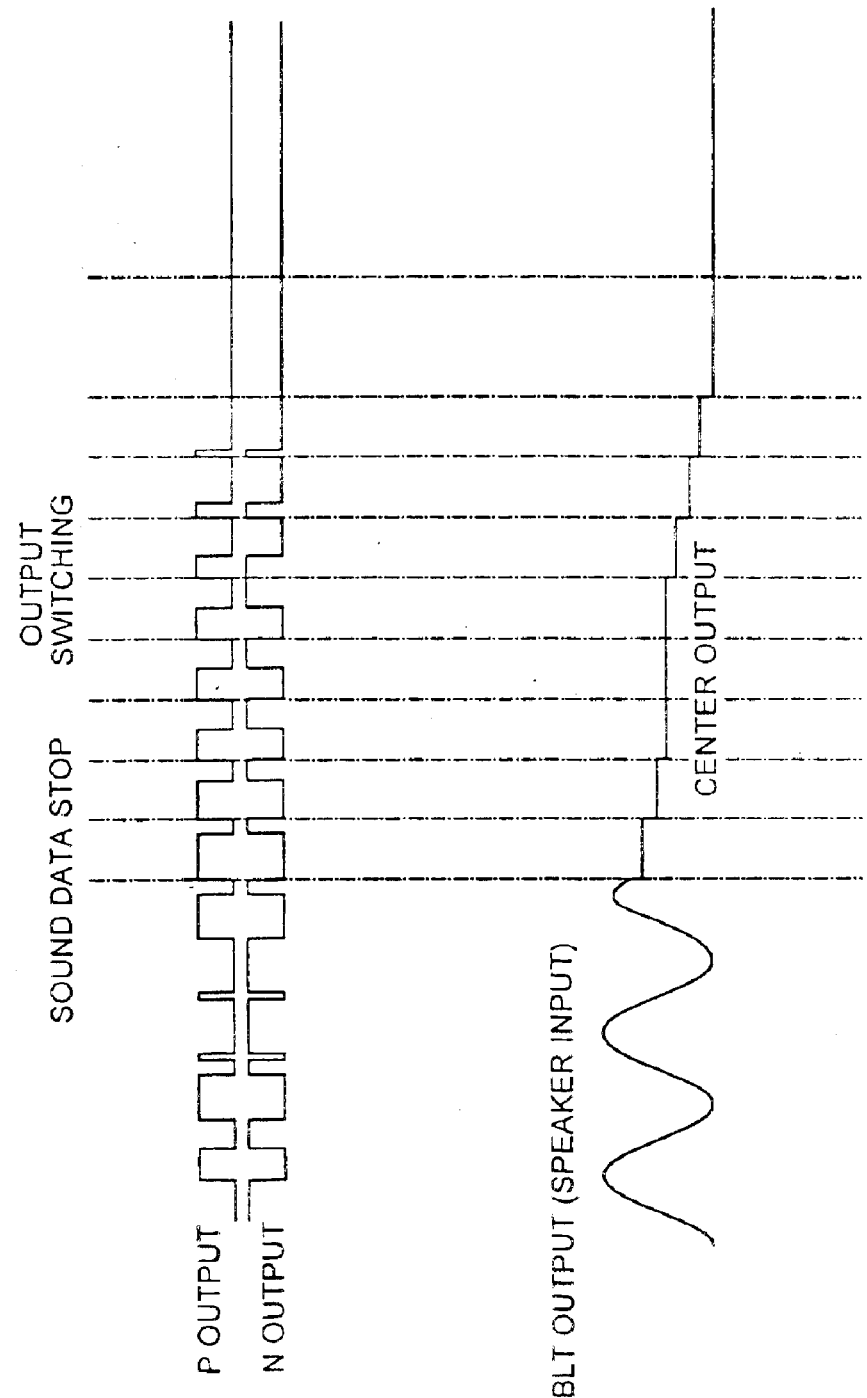
FIG. 5 shows the P output and the N output of the pulse width modulator and the output of the BTL circuit when the power is turned off.

FIG. 5 shows the P output and the N output of the pulse width modulator 13 and the output of the BTL circuit 2 when the power is turned off. The pulse width modulator 13 executes the pulse width modulating process based on the sound data input from the noise shaper 12 until the sound data is stopped to output the P output and the N output to the BTL circuit 2. The BTL circuit 2 drives the speakers 4 based on the P output and the N output to generate a sound.

When the power-off is detected, the pulse width modulator 13 successively changes the P output stage by stage from the value when the sound data is stopped, and sets the P output to the center output. That is, when the P output and the N output are +1 to +4 shown in FIG. 2, the pulse width modulator 13 successively decreases the P output and the N output stage by stage to set them to the center output. Further, when the P output and the N output are −1 to −4, the pulse width modulator 13 increases the P output and the N output stage by stage successively to set them to the center output. As a result, the output of the BTL circuit 2 changes gradually to be fixed to the center.

When the P output and the N output are fixed to the center output, the pulse width modulator 13 switches the N output from the inverted signal of the P output to a signal having the same phase as the P output. The pulse width modulator 13 decreases the P output stage by stage from the center output to set it to "−4".

Figure 6:
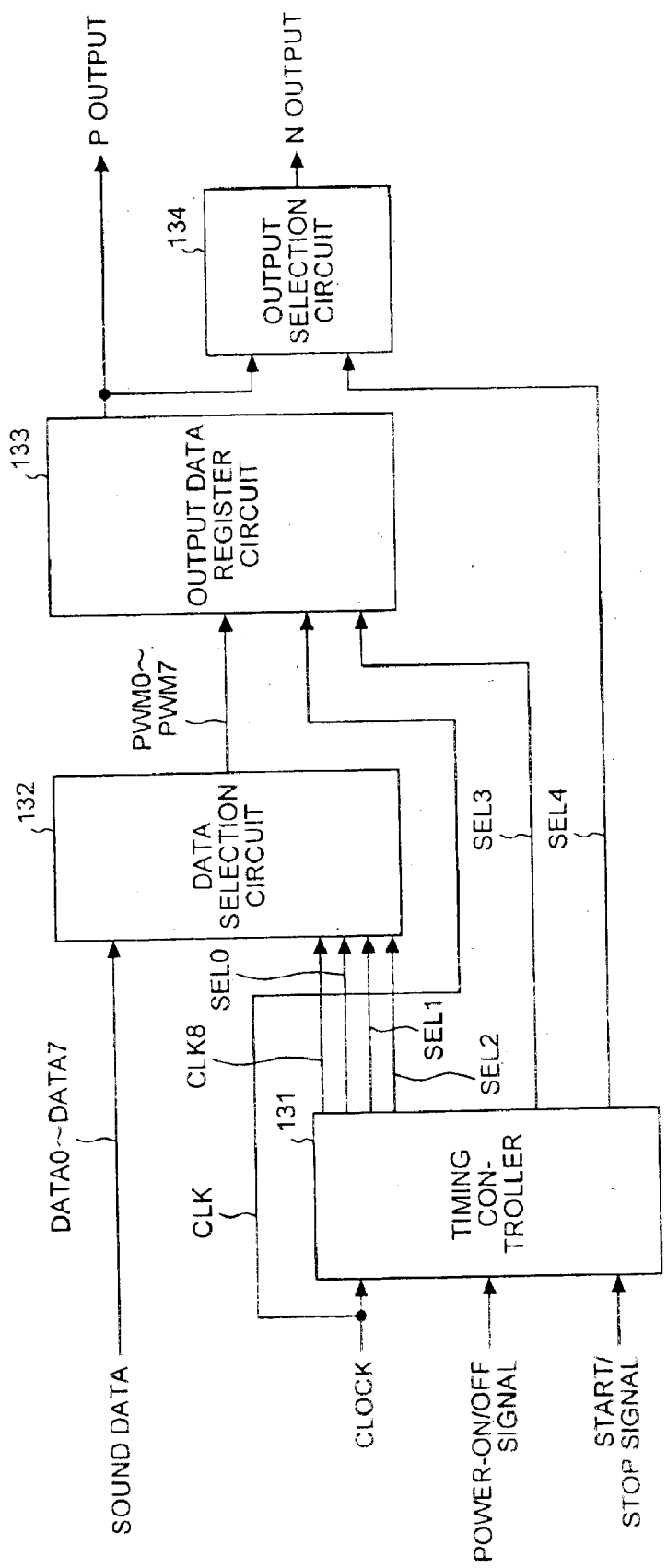
FIG. 6 shows a block diagram of the pulse width modulator.

FIG. 6 shows a block diagram of the configuration of the pulse width modulator 13. The pulse width modulator 13 includes a timing controller 131, a data selection circuit 132, an output data register circuit 133, and an output selection circuit 134.

The timing controller 131 generates a data setting clock CLK8 and selection signals SEL0 to SEL4 based on the clock CLK, a power ON/OFF signal, and a start/stop signal. The timing controller 131 outputs the selection signals SEL0 to SEL2 and the data setting clock CLK8 to the data selection circuit 132, the selection signal SEL3 to the output data register circuit 133, and the selection signal SEL4 to the output selection circuit 134.

The data selection circuit 132 selects either 8-bit sound data DATA0 to DATA7 input from the noise shaper 12 or predetermined data for removing the pop sound based on the selection signals SEL0 to SEL2, and outputs selected output PWM0 to PWM7 to the output data register circuit 133.

Figure 7:
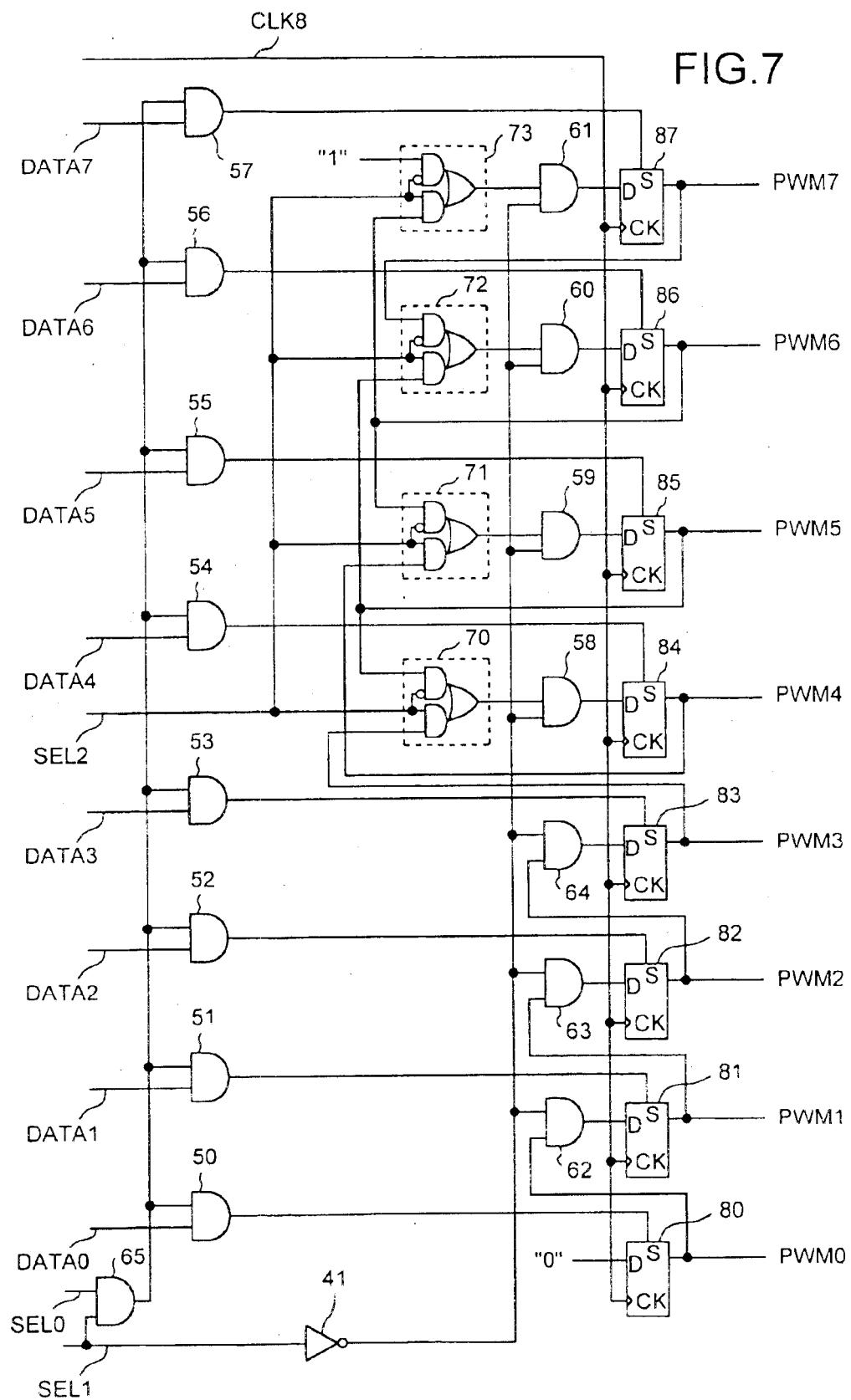
FIG. 7 shows one example of a data selection circuit.

FIG. 7 shows one example of the data selection circuit 132 shown in FIG. 6. The data selection circuit 132 has an inverter 41, AND gates 50 to 65, selectors 70 to 73 as selection circuits, and flip-flops 80 to 87. The flip-flops have a setting function. When the selection signal SEL0 is "1" and the selection signal SEL1 is "1", the output of the AND gate 65 becomes "1", and the AND gates 50 to 57 select the sound data DATA0 to DATA7 to set the sound data DATA0 to DATA7 in the flip-flops 80 to 87 having the setting function. As a result, the data selection circuit 132 outputs the sound data DATA0 to DATA7 to the output PWM0 to PWM7.

The selection signal SEL2 is effective when the selection signal SEL1 is "0". When the selection signal SEL1 is "0" and the selection signal SEL2 is "1", the flip-flops 80 to 87 having the setting functions are connected in the order of the flip-flops 80, 81, 82, . . . 87 to form an eight-stage shift register that shifts data on the rising edge of the data setting clock CLK8. Since a fixed value "0" is input into a terminal D of the flip-flop 80, the outputs PWM7 to PWM0 which are, for example "11111000", change through shift operation into "11110000" "11100000", . . . "00000000". That is, the value of the outputs PWM7 to PWM0 is changed stage by stage to be set to "00000000".

When the selection signal SEL1 is "0" and the selection signal SEL2 is "0", the flip-flops 80 to 83 are connected in the order of the flip-flops 80, 81, 82, and 83 to form a four-stage shift register that shifts data on the rising edge of the data setting clock CLK8. Moreover, the flip-flops 84 to 87 are connected in the order of the flip-flops 87, 86, 85 and 84 to form a four-stage shift register that shifts data on the rising edge of the data setting clock CLK8. Since "1" is input into the terminal D of the flip-flop 87, the outputs PWM7 to PWM4 change into "1000", "1100", "1110", and "1111". Moreover, since "0" is input into the terminal D of the flip-flop 80, the outputs PWM3 to PWM0 become "0000". That is, when the selection signal SEL1 is "0" and the selection signal SEL2 is "0", the outputs PWM7 to PWM0 change stage by stage so as to become the center output.

The output data register circuit 133 latches the output PWM0 to PWM7 of the data selection circuit 132 based on the selection signal SEL3, and synchronizes the latched output PWM0 to PWM7 with the clock CLK to output the output PWM0, PWM1, . . . , PWM7 in this order bit by bit as the P output signals. That is, the output data register circuit 133 converts the latched parallel output PWM0 to PWM7 into serial data based on the selection signal SEL3.

Figure 8:
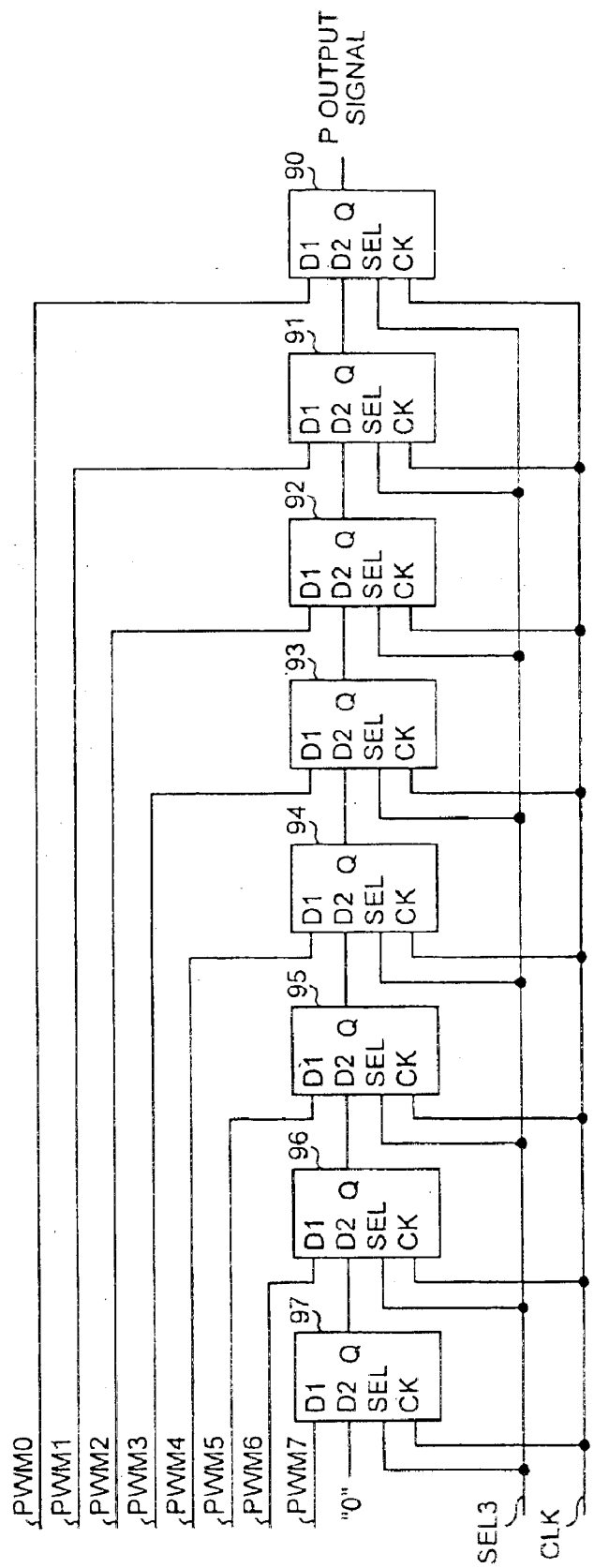
FIG. 8 shows one example of an output data register circuit.
Figure 9:
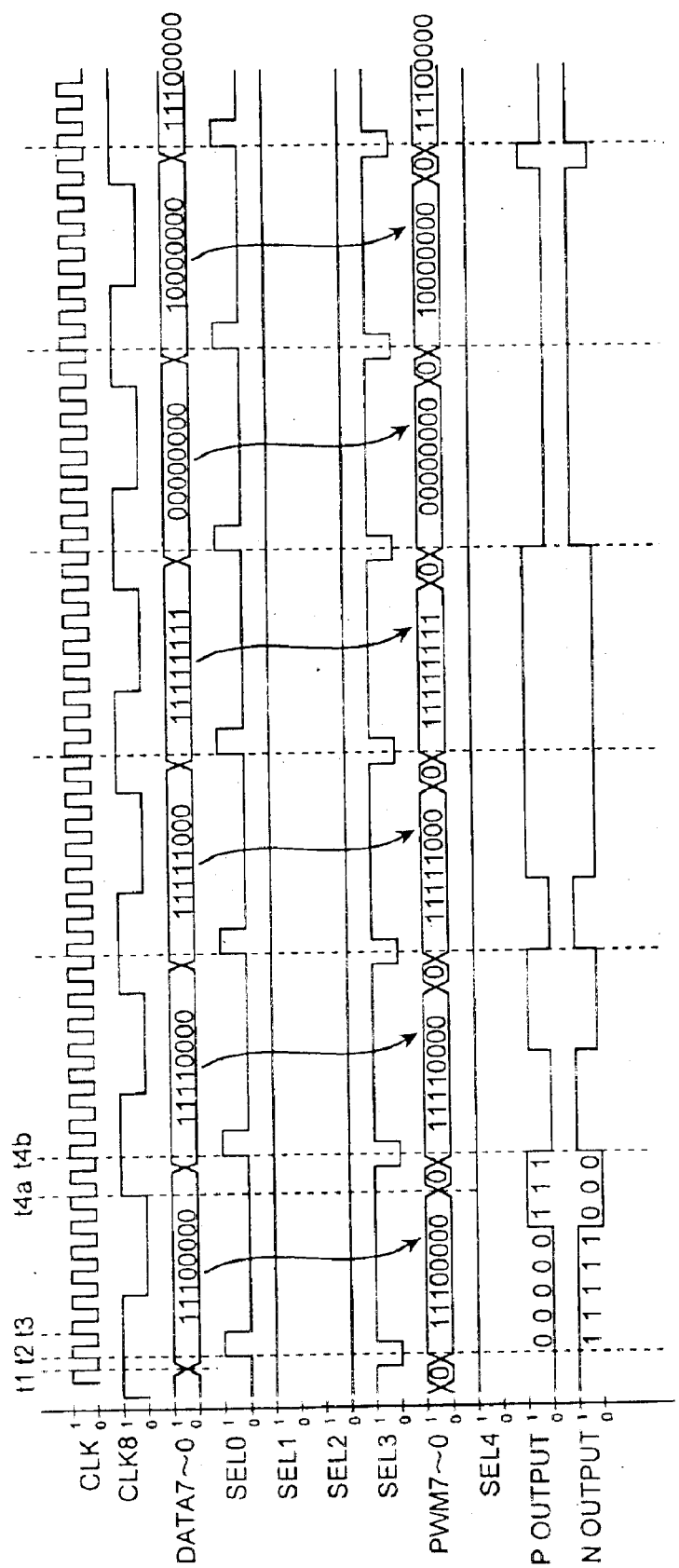
FIG. 9 shows a time chart of an operation of the pulse width modulator during normal operation.

FIG. 8 shows one example of the output data register circuit 133 shown in FIG. 6. The output data register circuit 133 has flip-flops 90 to 97 having a selector function. The flip-flops 90 to 97 having the selector function select data input in a terminal D2 when a terminal selection signal SEL ("terminal SEL") is "1", and select data input in a terminal D1 when the terminal SEL is "0" to output the data in synchronization with the rising edge of a terminal CK.

The flip-flops 90 to 97 are connected in the order of the flip-flops 97, 96, 95, . . . 90 to form an eight-stage shift register that shifts data in synchronization with the rising edge of the clock CLK.

The output selection circuit 134 makes a selection as to whether the P output signal is output as it is as the N output signal or the signal obtained by inverting the P output signal is output as the N output signal based on the selection signal SEL4. That is, the output selection circuit 134 selects either one of the N output set to the signal having the same phase as the P output and the N output set to the signal obtained by inverting the P output.

The operation of the pulse width modulator 13 will be explained below with reference to the time charts of FIG. 9 to FIG. 12. The normal operation will be explained first with reference to the time chart of FIG. 9.

In the case of the normal operation in which the sound data DATA7 to DATA0 input from the noise shaper 12 are output, the timing controller 131 sets the selection signal SEL1 to "1", the selection signal SEL2 to "0", and the selection signal SEL4 to "1". Moreover, the timing controller 131 outputs the data setting clock CLK8 obtained by dividing the clock CLK by eight in synchronization with the falling edge of the clock CLK. The sound data DATA7 to DATA0 are input in synchronization with the falling edge of the clock CLK in every eight periods of the data setting clock CLK8. The timing controller 131 outputs the data setting clock CLK8 so that the data setting clock CLK8 rises after seven periods of the clock CLK from the time when the sound data DATA7 to DATA0 change. The timing controller 131 also sets the selection signal SEL0 to "1" only by one period of the clock CLK in synchronization with the rising edge of the clock CLK after one and half periods of the clock CLK from the rising edge of the data setting clock CLK8, in every period of the data setting clock CLK8. In other words, the selection signal SEL0 becomes "1" only by one period of the clock CLK after half period of the clock CLK from the time when the sound data DATA7 to DATA0 change.

Further, the timing controller 131 sets the selection signal SEL3 to "0" by one period of the clock CLK in synchronization with the falling edge of the clock CLK after one period of the clock CLK from the rising edge of the data setting clock CLK8, in every period of the data setting clock CLK8. In other words, the selection signal SEL3 becomes "0" only by one period of the clock CLK from the time when the sound data DATA7 to DATA0 change. The data setting clock CLK8 and the selection signals SEL0 to SEL2 are generated so that timing constraints (e.g., recovery time, removal time, setup time, holding time, and pulse width) of the flip-flops 80 to 87 having a selector function are satisfied. The selection signal SEL3 is generated so that timing constraints of the flip-flops 90 to 97 having a selector function are satisfied.

The sound data DATA7 to DATA0 change to "11100000" at time t1. The selection signal SEL0 becomes "1" at time t2. Since the selection signal SEL0 is "1" and the selection signal SEL1 is "1", the output of the AND gate 65 becomes "1", and the AND gates 50 to 57 output the sound data DATA7 to DATA0 to terminals S of the flip-flops 87 to 80 having the setting function. As a result, "1" is input into the terminals S of the flip-flops 87 to 85, and "0" is input into the terminals S of the flip-flops 84 to 80, and therefore the PWM7 to PWM0 become "11100000". That is, the sound data DATA7 to DATA0 are output to the PWM7 to PWM0.

Since the selection signal SEL3 is "0", the flip-flops 97 to 90 having the selector function latch the outputs PWM7 to PWM0. The flip-flops 97 to 90 output the value of the output PWM0 (in this case, "0") to the P output. Since the selection signal SEL3 is "1" at time t3 which is the next rising edge of the clock CLK, the flip-flops 97 to 90 operate as the shift register. That is, the flip-flops 97 to 90 set the P output to "0", "0", "0", "0", "0", "1", "1", and "1" in synchronization with the rising edge of the clock until time t4b.

Since the selection signal SEL4 is "0", the output selection circuit 134 outputs the signal obtained by inverting the P output to the N output.

The data setting clock CLK8 changes from "0" to "1" at time t4a. At this time, since the selection signal SEL0 is "0", the output of the AND gate 65 becomes "0". Therefore, the AND gates 50 to 57 output "0" to the terminals S of the flip-flops 87 to 80 having the setting function. Since the selection signal SEL1 is "1", "0" is input into the AND gates 58 to 64 via the inverter 41 and the terminal D of the flip-flop 80 is fixed to "0". Since the terminals S of the flip-flops 80 to 87 are "0", the flip-flops 80 to 87 latch and output "0" of the terminal D at the rising edge of the data setting clock. As a result, all the output of the flip-flops 80 to 87 become "0", and this means a reset of the sound data DATA7 to DATA0 that have been set at time t2.

The data selection circuit 132 and the output data register circuit 133 repeat such operations, and output the sound data DATA7 to DATA0 input from the noise shaper 12 to the P output and the N output.

Figure 10:
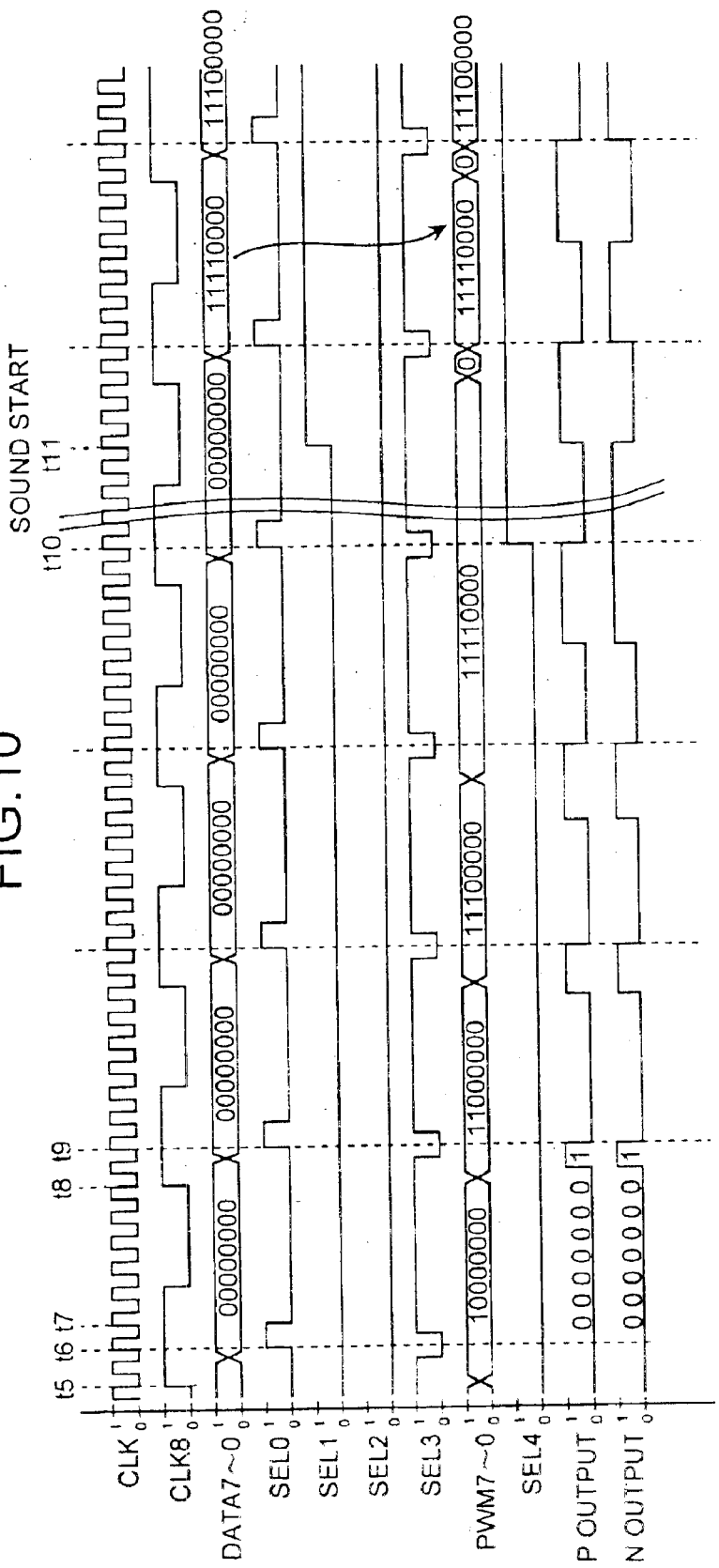

The operation of the pulse width modulator 13 at the time of power-on will be explained below with reference to the time chart of FIG. 10. When detecting the power-on based on the power ON/OFF signal, the timing controller 131 sets the selection signals SEL1, SEL2, and SEL4 to "0". The timing controller 131 also outputs the data setting clock CLK8 obtained by dividing the clock CLK by eight in synchronization with the falling edge of the clock CLK. Moreover, the timing controller 131 sets the selection signal SEL3 to "0" only by one period of the clock CLK, in synchronization with the falling edge of the clock CLK in every period of the data setting clock CLK8. Further, the timing controller 131 sets the selection signal SEL3 to "0" only by one period of the clock CLK in every period of the data setting clock CLK8, in synchronization with the falling edge of the clock CLK.

Since the selection signal SEL1 is "0", the output of the AND gate 65 becomes "0", and the AND gates 50 to 57 output "0" into the terminals S of the flip-flops 80 to 87 having the setting function. As a result, the flip-flops 80 to 87 latch the data in the terminals D on the rising edge of the clock input into terminals CK and output the latched data. Since the selection signal SEL2 is "0", the flip-flops 87 to 84 operate as the four-stage shift register.

When the data setting clock CLK8 rises at time t5, the flip-flops 80 to 83 shift the data. Moreover, the flip-flops 87 to 84 also shift the data. Since the flip-flop 80 latches "0" and the flip-flop 87 latches "1", the outputs PWM7 to PWM0 become "10000000".

Since the selection signal SEL3 is "0" at time t6, the flip-flops 97 to 90 having the selector function latch the outputs PWM7 to PWM0. The flip-flops 97 to 90 output the value of the output PWM0 (in this case, "0") into the P output. Since the selection signal SEL3 is "1" at time t7 which is the next rising edge of the clock CLK, the flip-flops 97 to 90 operate as the shift register. That is, the flip-flops 97 to 90 set the P output to "0", "0", "0", "0", "0", "0", "0", and "1" in synchronization with the rising edge of the clock until time t9.

Since the selection signals SEL1 and SEL2 do not change from time t5 up to time t8, the data selection circuit 132 performs the same operation as that at time t5. That is, when the data setting clock CLK8 rises, the flip-flops 80 to 83 having the setting shift the data. Moreover, the flip-flops 87 to 84 also shift the data. Since the flip-flop 80 latches "0" and the flip-flop 87 latches "1", the outputs PWM7 to PWM0 become "11000000".

At time t9, the flip-flops 97 to 90 having the selector function perform the same operation as that at time t6 and latch the outputs PWM7 to PWM0. The flip-flops 97 to 90 output the outputs PWM0, PWM1, . . . PWM7 in this order in synchronization with the rising edge of the clock CLK. That is, the flip-flops 97 to 90 set the P output to "0", "0", "0", "0", "0", "0", "1", and "1" in synchronization with the rising edge of the clock.

The data selection circuit 132 and the output data register circuit 133 repeat such operations until time t11 at which the selection signal SEL1 becomes "1", and change the P output stage by stage to fix it to the center output.

Since the selection signal SEL4 is "0" until time t10, the output selection circuit 134 outputs the signal having the same phase as that of the P output to the N output.

The timing controller 131 sets the selection signal SEL4 to "1" at time t10. That is, after the P output is fixed to the center output (in this case, for not less than four periods from the first rising edge of the data setting clock. CLK8), the timing controller 131 sets the selection signal SEL4 to "1".

When the selection signal SEL4 becomes "1", the output selection circuit 134 outputs the signal obtained by inverting the P output to the N output.

The timing controller 131 sets, after setting the selection signal SEL4 to "1", the selection signal SEL1 to "1" at a predetermined timing. In the time chart shown in FIG. 10, the timing controller 131 sets the selection signal SEL1 to "1". In other words, the timing controller 131 sets the selection signal SEL4 to "1" after the P output is fixed to the center output, sets the N output to a signal obtained by inverting the polarity of the P output, and then sets the selection SEL1 to "1" to enter the normal operation mode. As a result, the P output and the N output are based on the sound data DATA7 to DATA0.

Figure 11:
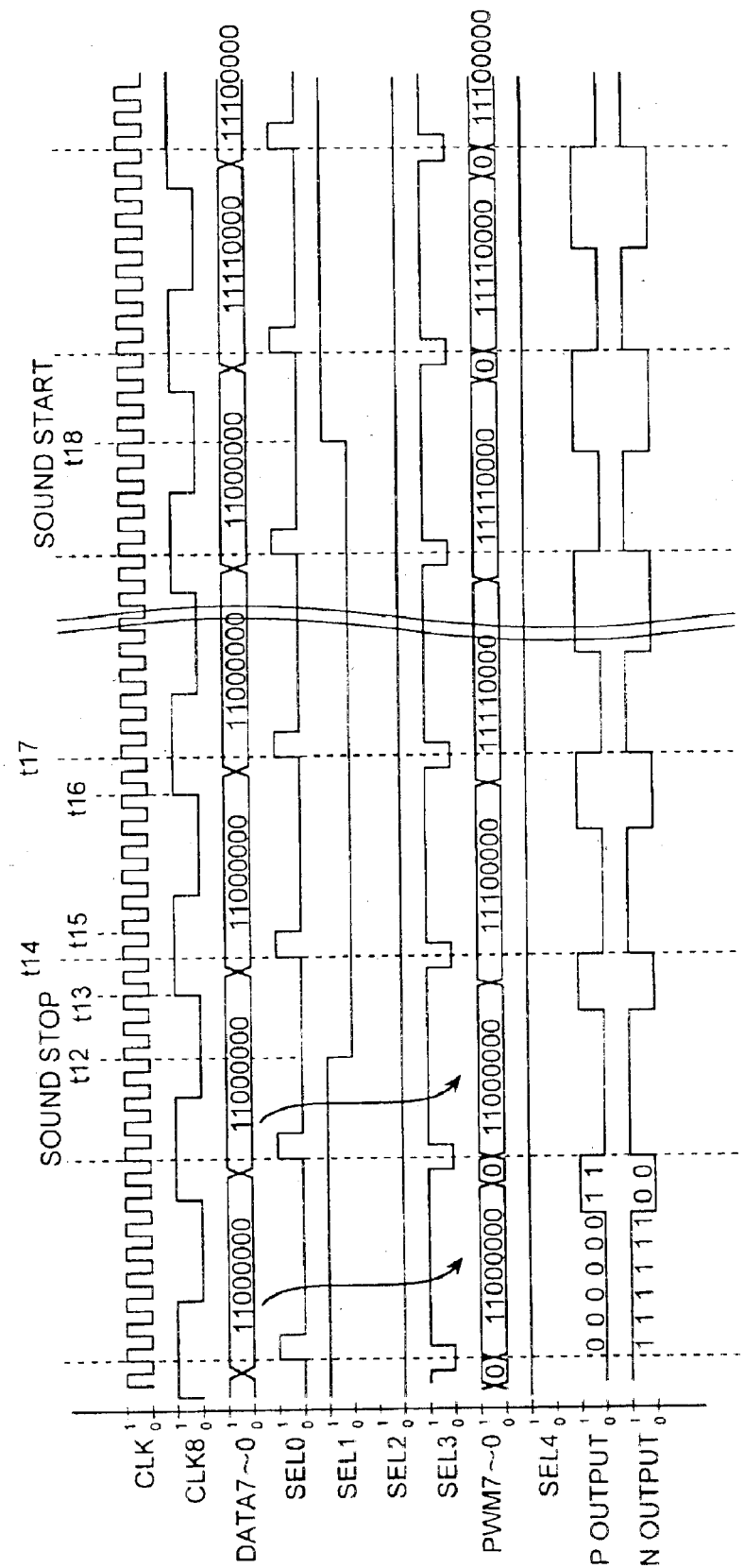
FIG. 11 shows a time chart of the operation of the pulse width modulator when the sound data is stopped and then started.

The operation of the pulse width modulator 13 when the sound data is paused and are started to be reproduced will be explained below with reference to FIG. 11. The pulse width modulator 13 performs the normal operation until time t12. That is, the pulse width modulator 13 outputs the P output and the N output based on the sound data DATA7 to DATA0.

When detecting the stopping of the sound data based on the start/stop signal at time t12, the timing controller 131 sets the selection signal SEL1 to "0".

The output of the AND gate 65 becomes "0" during the selection signal SEL1 is "0", regardless of the selection signal SEL0, and the AND gates 50 to 57 output "0" to the terminals S of the flip-flops 80 to 87 having the setting function. As a result, the flip-flops 80 to 87 latch the data in the terminals D on the rising edge of the clock to be input into the terminals CK, and output the latched data. Since the selection signal SEL2 is "0", the flip-flops 87 to 84 operate as the four-stage shift register.

When the data setting clock CLK8 rises at time t13, the flip-flops 80 to 83 shift the data. Moreover, the flip-flops 87 to 84 also shift the data. Since the last outputs PWM7 to PWM0 are "11000000" and the flip-flop 80 latches "0" and the flip-flop 87 latches "1", the outputs PWM7 to PWM0 become "11100000".

The selection signal SEL3 is "0" at time t14, and therefore, when the clock CLK rises, the flip-flops 97 to 90 having the selector function latch the outputs PWM7 to PWM0. The flip-flops 97 to 90 output the value of the output PWM0 (in this case, "0") into the P output. Since the selection signal SEL3 is "1" at time t15 which is the next rising edge of the clock CLK, the flip-flops 97 to 90 operate as the shift register. That is, the flip-flops 97 to 90 set the P output to "0", "0", "0", "0", "0", "1", "1", and "1" in synchronization with the rising edge of the clock until time t17.

At time t17, the flip-flops 97 to 90 perform the same operation as that at time t4b to latch the outputs PWM7 to PWM0. The flip-flops 97 to 90 output the outputs PWM0, 1, . . . 7 in this order in synchronization with the rising edge of the clock CLK. That is, the flip-flops 97 to 90 set the P output to "0", "0", "0", "0", "1", "1", "1", and "1" in synchronization with the rising edge of the clock.

The data selection circuit 132 and the output data register circuit 133 repeat such operations until time t18 at which the selection signal SEL1 becomes "1", and change the P output stage by stage to fix the P output to the center output. Since the selection signal SEL4 is "1" during this operation, the output selection circuit 134 outputs a signal obtained by inverting the P output, to the N output.

When detecting the starting of the sound data based on the start/stop signal at time t18, the timing controller 131 sets the selection signal SEL1 to "1". As a result, the normal operation mode is selected, and the P output and the N output are based on the sound data DATA7 to DATA0.

Figure 12:
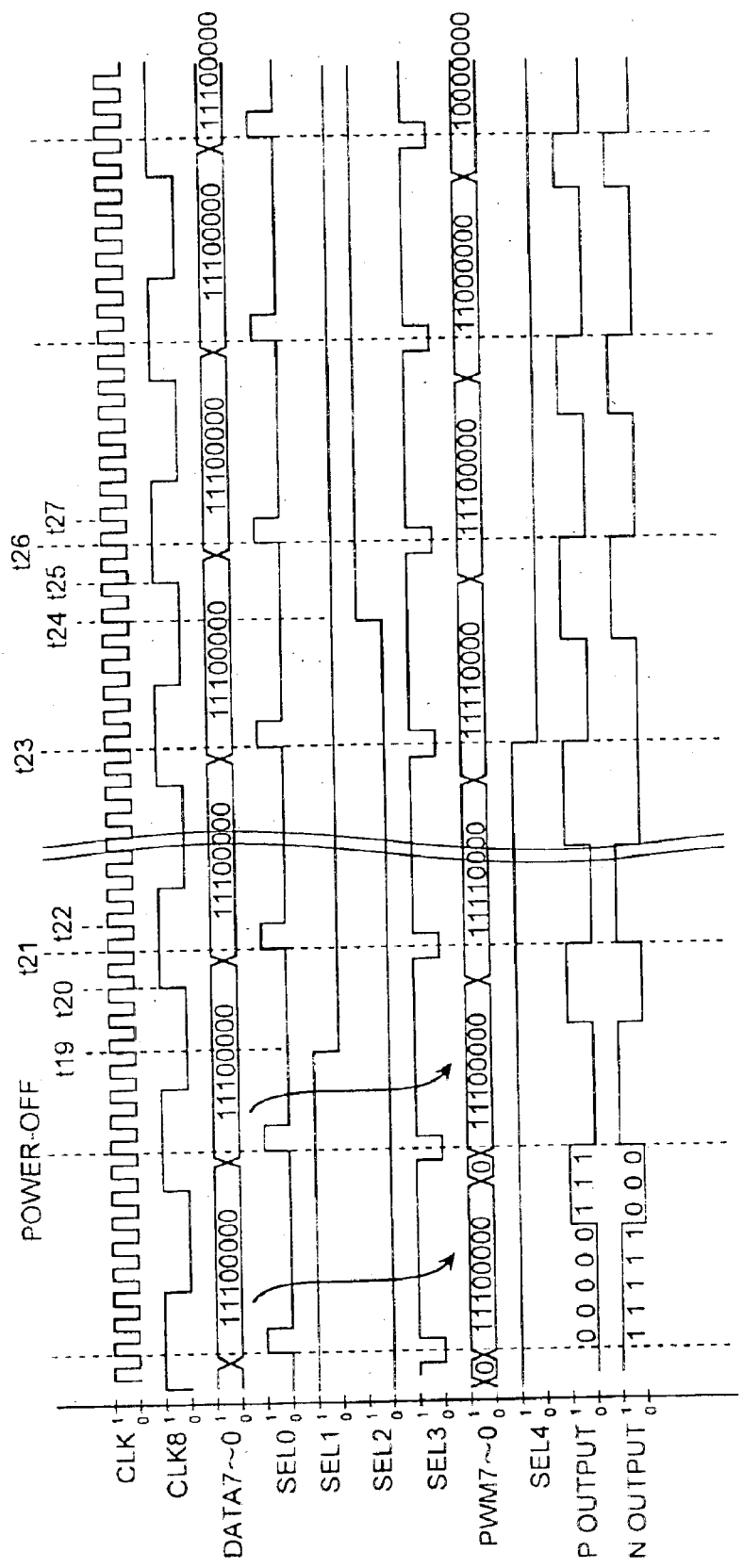
FIG. 12 shows a time chart of the operation of the pulse width modulator when the power is turned off.

The operation of the pulse width modulator 13 at the time of the power-off will be explained below with reference to the time chart of FIG. 12. The pulse width modulator 13 performs the normal operation until time t19. That is, the pulse width modulator 13 performs the P output and the N output based on the sound data DATA7 to DATA0.

When the power ON/OFF signal is changed from "0" to "1" at time t19, that is, the power-off is detected, the timing controller 131 sets the selection signal SEL1 to "0".

The output of the AND gate 65 becomes "0" during the selection signal SEL1 is "0", regardless of the selection signal SEL0, and the AND gates 50 to 57 output "0" into the terminals S of the flip-flops 80 to 87 having the setting function. As a result, the flip-flops 80 to 87 latch the data in the terminals D on the rising edge of the clock input into the terminals CK and output the latched data. Since the selection signal SEL2 is "0", the flip-flops 87 to 84 having the setting function operate as the four-stage shift register.

When the data setting clock CLK8 rises at time t20, the flip-flops 80 to 83 shift the data. Moreover, the flip-flops 87 to 84 also shift the data. Since the last outputs PWM7 to PWM0 are "11100000" and the flip-flop 80 latches "0" and the flip-flop 87 latches "1", the outputs PWM7 to PWM0 become "11110000".

Since the selection signal SEL3 is "0" at time t21, when the clock CLK rises, the flip-flops 97 to 90 having the selector function latch the outputs PWM7 to PWM0. The flip-flops 97 to 90 output the value of the output PWM0 (in this case, "0") to the P output. Since the selection signal SEL3 is "1" at time t22 which is the next rising edge of the clock CLK, the flip-flops 97 to 90 operate as the shift register. That is, the flip-flops 97 to 90 set the P output to "0", "0", "0", "0", "1", "1", "1", and "1" in synchronization with the rising edge of the clock.

The timing controller 131 sets the selection signal SEL4 to "1" at time t23. That is, timing controller 131 fixes the P output to the center output (in this case, for not less than four periods from the first rising edge of the data setting clock CLK8), and then sets the selection signal SEL4 to "0".

When the selection signal SEL4 becomes "0", the output selection circuit 134 outputs the signal having the same phase as that of the P output to the N output.

The timing controller 131 sets the selection signal SEL2 to "1" at time t24 after the selection signal SEL4 is set to "0". Since the selection signal SEL1 is "0", when the selection signal SEL2 becomes "1", the flip-flops 80 to 87 become an eight-stage shift register.

When the data setting clock CLK8 rises at time t25, the flip-flops 80 to 87 shift the data. Since the flip-flop 80 latches the data, the outputs PWM7 to PWM0 become "11100000".

Since the selection signal SEL3 is "0" at time t26, when the clock CLK rises, the flip-flops 97 to 90 latch the outputs PWM7 to PWM0. The flip-flops 97 to 90 output the value of the output PWM0 (in this case, "0") into the P output. Since the selection signal SEL3 is "1" at time t27 which is the next rising edge of the clock CLK, the flip-flops 97 to 90 operate as the shift register. That is, the flip-flops 97 to 90 set the P output to "0", "0", "0", "0", "0", "1", "1", and "1" in synchronization with the rising edge of the clock.

The data selection circuit 132 and the output data register circuit 133 repeat such operations and change the P output stage by stage to set the P output to "−4" (see FIG. 2).

In this embodiment, at the time of the power-on, the N output and the P output are made to have the same phase and are output, and the N output and the P output are changed stage by stage to be fixed to the center output. Thereafter, the N output is switched to the output obtained by inverting the polarity of the P output. As a result, the BTL circuit driven by the digital amplifier is started smoothly, and the P output and the N output can be changed into the center output without producing any noise. Further, the sound data starts from the center output, and therefore reproduction of the sound data from which the pop noise is removed can be started without using a muting circuit.

At the time of power-off, the P output and the N output are changed stage by stage and are fixed to the center output. Thereafter, the N output and the P output are made to have the same phase to be output, and the P output and the N output are decreased stage by stage so as to be the lowest output. As a result, the pop noise can be reduced.

When the sound data is stopped, the P output and the N output are changed stage by stage so as to be fixed to the center output. That is, the P output and the N output are designed to be set to the center output. As a result, when the sound data is started, occurrence of an abrupt change is suppressed without using the muting circuit, and reproduction of the sound data can be started without producing the pop noise.

It is noted that a clock of the noise shaper may be used instead of the data setting clock. As a result, the P output and the N output can be changed into the center output or the lowest output in synchronization with the noise shaper, and further the pop noise can be suppressed.

The circuit driven by the digital amplifier of the present invention is not limited to the BTL circuit, and it may be any circuit such as an operational amplifier circuit or a filter circuit driven by the differential input.

As explained above, according to the digital amplifier of the present invention, when detecting the power-on, detecting the stopping of the sound data, or detecting the power-off, the data selection circuit increases or decreases the P output and the N output stage by stage at every period of the data setting clock obtained by dividing the basic clock for the pulse width modulation by n so as to fix them to the center output. As a result, when the sound data is started, the abrupt change in the P output and the N output can be suppressed and the production of the pop noise can be suppressed without using the muting circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A digital amplifier comprising:
   a noise shaper for removing a quantization noise of received data to generate sound data of n bits, where n is an integer larger than one; and
   a pulse width modulator for modulating a pulse width of output data in response to the sound data in a normal operation, the pulse width modulator including
      a data selection circuit for performing either one of increase and decrease of the pulse width of the output data stage by stage at every period of a specific clock obtained by dividing a frequency of a basic clock of pulse width modulation by n to set the output data to a center output when a specific operation is indicated.

2. The digital amplifier according to claim 1, wherein the specific operation is a detection of power-off, and the data selection circuit decreases the output data stage by stage at every period of the specific clock to set the output data to a lowest output after setting the output data to the center output.

3. The digital amplifier according to claim 1, wherein the specific operation is a detection of power-on, the output data includes a P output and an N output complementary to each other, a phase of the P output is same as a phase of the N output until the data selection circuit sets the output data to the center output, and the phase of the P output is opposite to the phase of the N output after the data selection circuit sets the output data to the center output.

4. The digital amplifier according to claim 3, wherein the pulse width modulator further includes an output selection circuit for generating, as the N output, a signal having the same phase as the phase of the P output until the data selection circuit sets the output data to the center output, and generating, as the N output, a signal obtained by inverting the P output after the data selection circuit sets the output data to the center output.

5. The digital amplifier according to claim 1, wherein the specific operation is a detection of power-off, the output data includes a P output and an N output complementary to each other, a phase of the P output is opposite to a phase of the N output until the data selection circuit sets the output data to the center output, and the phase of the P output is same as the phase of the N output after the data selection circuit sets the output data to the center output.

6. The digital amplifier according to claim 5, wherein the pulse width modulator further includes an output selection circuit for generating, as the N output, a signal obtained by inverting the P output until the data selection circuit sets the output data to the center output, and generating, as the N output, a signal having the same phase as the phase of the P output after the data selection circuit sets the output data to the center output.

7. The digital amplifier according to claim 1, wherein the specific clock is a clock of the noise shaper.

8. The digital amplifier according to claim 1, wherein the specific operation is a detection of stopping of the sound data, the output data includes a P output and an N output complementary to each other, a phase of the P output is opposite to a phase of the N output until the data selection circuit sets the output data to the center output.

* * * * *